United States Patent
Ang et al.

(10) Patent No.: US 6,632,712 B1
(45) Date of Patent: Oct. 14, 2003

(54) METHOD OF FABRICATING VARIABLE LENGTH VERTICAL TRANSISTORS

(75) Inventors: Chew-Hoe Ang, Singapore (SG); Eng Hua Lim, Singapore (SG); Randall Cha, Singapore (SG); Jia Zhen Zheng, Singapore (SG); Elgin Quek, Singapore (SG); Mei Sheng Zhou, Singapore (SG); Daniel Yen, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/263,895

(22) Filed: Oct. 3, 2002

(51) Int. Cl.[7] .......................................... H01L 21/8238
(52) U.S. Cl. .................. 438/212; 438/269; 438/138; 257/328
(58) Field of Search ................. 438/199, 203, 438/206, 209, 212, 213, 221, 222, 223, 224, 226, 227, 228, 229, 230, 231, 232, 267, 135, 136, 137, 138, 139, 156, 173, 192, 154, 153, 268, 269, 270, 271, 279, 286, 197, 585; 257/328, 329, 330, 331, 332, 369

(56) References Cited

U.S. PATENT DOCUMENTS

| | | | |
|---|---|---|---|
| 5,918,115 A | 6/1999 | Kikuchi et al. | 438/138 |
| 5,963,800 A | 10/1999 | Augusto | 438/212 |
| 6,069,384 A | 5/2000 | Hause et al. | 257/330 |
| 6,084,264 A | 7/2000 | Darwish | 257/329 |
| 6,225,165 B1 | 5/2001 | Noble, Jr. et al. | 438/268 |
| 6,461,900 B1 * | 10/2002 | Sundaresan et al. | 438/156 |

* cited by examiner

*Primary Examiner*—Jack Chen
(74) *Attorney, Agent, or Firm*—George O. Saile; Rosemary L. S. Pike

(57) ABSTRACT

A process for fabricating vertical CMOS devices, featuring variable channel lengths, has been developed. Channel region openings are defined in composite insulator stacks, with the channel length of specific devices determined by the thickness of the composite insulator stack. Selective removal of specific components of the composite insulator stack, in a specific region, allows the depth of the channel openings to be varied. A subsequent epitaxial silicon growth procedure fills the variable depth channel openings, providing the variable length, channel regions for the vertical CMOS devices.

31 Claims, 7 Drawing Sheets

METHOD OF FABRICATING VARIABLE LENGTH VERTICAL TRANSISTORS

BACKGROUND OF THE INVENTION (1) Field of the Invention

The present invention relates to methods!used to fabricate semiconductor devices, and more specifically to a method used to fabricate vertical transistors featuring variable channel lengths.

(2) Description of Prior Art

The advent of micro-miniaturization, or the ability to fabricate semiconductor devices with sub-micron, or deep sub-micron features, has allowed a greater number of smaller semiconductor chips to be obtained from a specific size starting semiconductor substrate, resulting in a reduction of processing costs for a specific semiconductor chip. The smaller semiconductor chips still offer device densities equal to, or greater than, counterpart semiconductor chips, comprised with larger features. Advances in specific semiconductor disciplines, such as photolithography, have allowed the attainment of sub-micron features to be routinely achieved. The use of more sophisticated exposure cameras, as well as the development of more sensitive photoresist materials, have allowed images of less than 0.25 um to be resolved for photoresist shapes and for features defined using these deep sub-micron photoresist shapes as an etch mask. Still the limiting resolution provided by present photolithographic procedures, restrict the level of miniaturization available for horizontal type, semiconductor devices.

This invention will describe the fabrication of vertical type semiconductor devices, in which the channel length of a metal oxide semiconductor field effect (MOSFET) device is not defined by limiting photolithographic procedures, but by the thickness of deposited materials. This invention will also describe a unique fabrication process for vertical type, complimentary metal oxide semiconductor (CMOS), featuring both P channel (PMOS), and N channel (NMOS), devices, with the ability to form variable length channel lengths. Prior art, such as Hause et al, in U.S. Pat. No. 6,069,384, describe a method of fabricating a vertical transistor structure, however that prior art does not offer the process described in this present invention in which both NMOS and PMOS vertical devices are formed with variable channel lengths.

SUMMARY OF THE INVENTION

It is an object of this invention to fabricate vertical, metal oxide semiconductor field effect transistors (MOSFET), devices, on a semiconductor substrate.

It is another object of this invention to form vertical devices featuring variable channel lengths, specific channel lengths for specific devices, with the vertical channel length determined by the thickness of a deposited insulator, or deposited composite insulator layer.

It is still another object of this invention to form CMOS devices, P channel (PMOS), and N channel (NMOS), devices, comprised with variable channel length devices, on the same semiconductor chip.

In accordance with the present invention a method of fabricating vertical CMOS devices on a semiconductor chip, featuring devices comprised with variable channel lengths, is described. A heavily doped N type region, to be used as a drain region for a subsequent vertical NMOS device, is formed in a first region of a semiconductor substrate, followed by formation of a heavily doped P type region, to be used as a drain region for a subsequent vertical PMOS device, in a second region of the semiconductor substrate. After deposition of a first silicon oxide layer and of a first silicon nitride layer, patterning procedures are employed to remove the first silicon nitride layer from the first silicon oxide layer in the PMOS region. Deposition of a second silicon nitride layer and of an overlying second silicon oxide layer results in a first composite insulator layer in the NMOS region comprised of second silicon oxide layer, second silicon nitride layer, first silicon nitride layer, and first silicon oxide layer, while a thinner, second composite insulator layer, comprised of second silicon oxide layer, second silicon nitride layer, and first silicon oxide layer resides in the PMOS region. Channel openings are next formed in the first composite insulator layer exposing a portion of the top surface of the N type drain region, and in the thinner, second composite insulator layer exposing a portion of the top surface of the P type drain region. An epitaxial silicon layer is then selectively grown filling the channel openings. A thin polysilicon layer is then deposited followed by photolithographic masking procedures allowing the portion of the thin polysilicon layer located in the NMOS region to be doped N type via ion implantation procedures, then allowing the portion of thin polysilicon layer, located in the PMOS region, to be doped P type. After deposition of a third silicon oxide layer photolithographic and selective dry etch procedures are used to remove exposed portions of third silicon oxide layer, of N type and P type, thin polysilicon layer, and of second silicon oxide layer, with the selective dry etch procedure terminating at the appearance of the second silicon nitride layer, creating thin polysilicon shapes, to be used as source regions, and creating underlying second silicon oxide shapes to be used as insulator spacers for the subsequent CMOS devices. After removal of the photoresist mask used for definition of the above shapes a wet etch procedure is employed to remove second and first silicon nitride layers in the NMOS region, exposing a first length of selective epitaxial silicon to be used for the NMOS channel region, and to remove second silicon nitride layer in the PMOS region, exposing a shorter length of selective epitaxial silicon to be used for the PMOS channel region. A silicon dioxide gate insulator layer is formed on the channel regions, as well as on the sides of the N type, and P type polysilicon shapes. A thick polysilicon layer is deposited and again doped N type in the NMOS region, and doped P type in the PMOS region. A selective, anisotropic dry etch procedure removes regions of thick polysilicon layer not covered by the overlying third silicon oxide—thin polysilicon—second silicon oxide shapes, resulting in: a vertical NMOS device, comprised of a thick, N type polysilicon shape, surrounding the silicon dioxide gate insulator layer in a region in which the gate insulator layer overlays a channel region comprised of the first length of selective epitaxial silicon; and a vertical PMOS device, comprised of a thick, P type polysilicon shape, surrounding the silicon dioxide gate insulator layer in a region in which the gate insulator layer overlays a channel region comprised of a shorter, second length of selective epitaxial silicon. Each channel region is located between an overlying thin, doped polysilicon source and silicon oxide spacers, and underlying heavily doped drain regions.

BRIEF DESCRIPTION OF THE DRAWINGS

The object and other advantages of this invention are best described in the preferred embodiment, with reference to the attached drawings that include.

DESCRIPTION OF THE PREFERRED EMBODIMENTS

Figure 1:
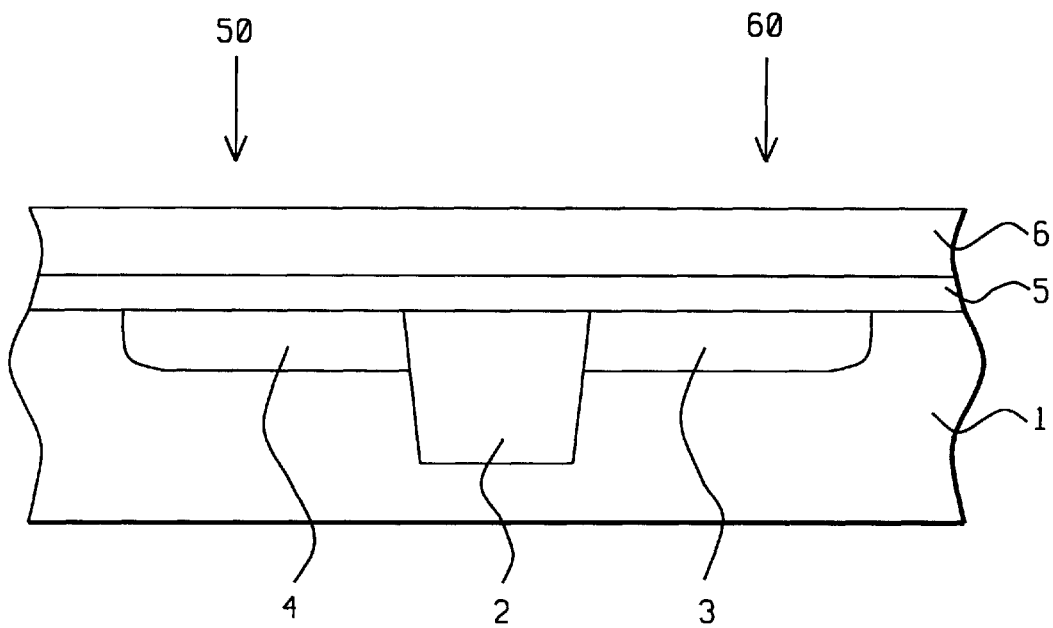
FIGS. 1–14, which schematically in cross-sectional style show key process stages used to fabricate vertical CMOS devices, featuring devices comprised with variable channel lengths, on the same semiconductor chip.

The method of forming vertical CMOS devices, with the ability to form devices with variable channel lengths on the same semiconductor chip, will now be described in detail. Semiconductor substrate 1, comprised of P type single crystalline silicon with a <100> crystallographic orientation, is used and schematically shown in FIG. 1. Shallow trench isolation (STI), region 2, is used to isolate region 50, of semiconductor substrate 1, to be used for subsequent N channel (NMOS), devices, from region 60, of semiconductor substrate 1, to subsequently used to accommodate P channel (PMOS) devices. STI region 2, is formed by initially defining a shallow trench shape in semiconductor substrate 1, via photolithographic and dry etching procedures, followed by filling of the shallow trench shape with a chemically vapor deposited (CVD), insulator layer such as silicon oxide. Chemical mechanical polishing (CMP), or selective, reactive ion etching (RIE), procedures are then used to remove unwanted portions of the filling insulator layer from the top surface of semiconductor substrate 1, resulting in formation of STI region 2. A photoresist shape, not shown in drawings, is used as a mask to allow an implantation procedure, using boron ions at an energy between about 2 to 10 KeV, at a dose between about 1E15 to 6E15 atoms/cm$^2$, to form heavily doped P type region 3, in region 60, of semiconductor substrate 1, to be used for PMOS devices. Heavily doped P type region 3, will be used as the heavily doped P type drain for the PMOS devices. After removal of the masking photoresist shape via plasma oxygen ashing, another photoresist shape, again not shown in the drawings, is used as a mask to protect PMOS region 60, from an implantation procedure used to from heavily doped N type drain region 4, in region 50, of semiconductor substrate 1, where region 50, is to be used to accommodate NMOS devices. This implantation procedure is performed using arsenic or phosphorous ions, at an energy between about 40 to 90 KeV, at an implant dose between about 1E15 to 8E15 atoms/cm$^2$. The result of these procedures is schematically shown in FIG. 1. Silicon oxide layer 5, is next deposited at a thickness between about 50 to 200 Angstroms, via low pressure chemical vapor deposition (LPCVD), or via plasma enhanced chemical vapor deposition (PECVD) procedures, followed by the deposition of silicon nitride layer 6, at a thickness between about 300 to 5000 Angstroms, again via LPCVD or PECVD procedures. The result of these depositions is again schematically shown in FIG. 1.

Figure 2:
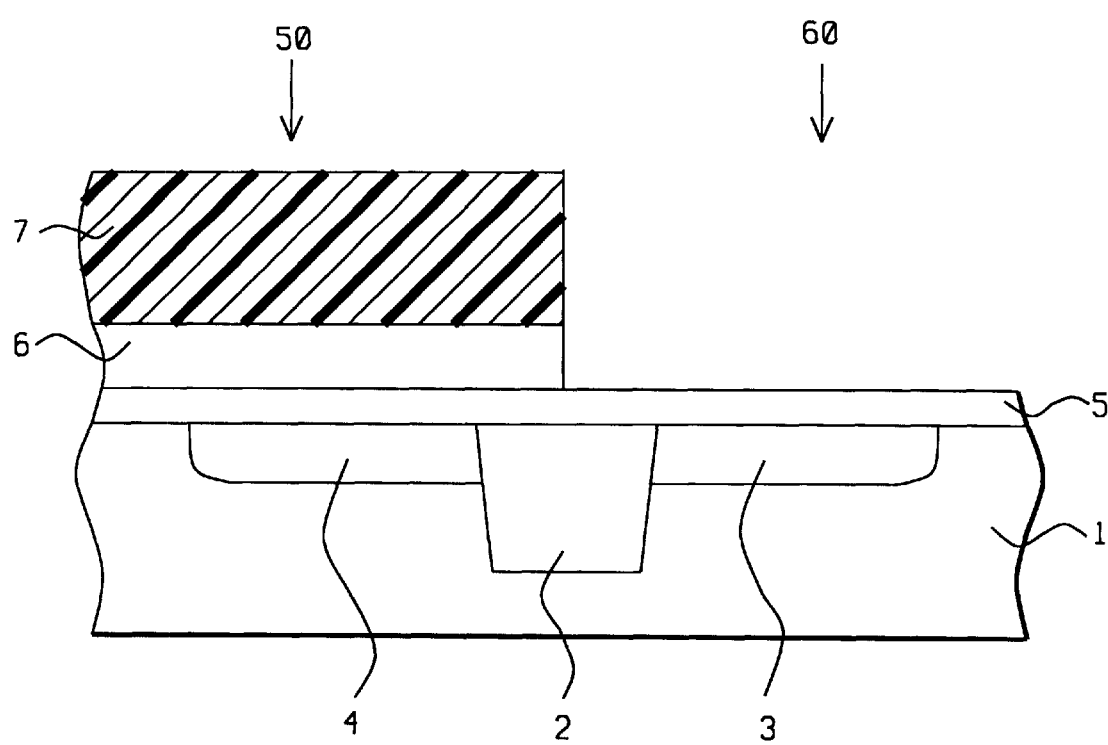
Figure 3:
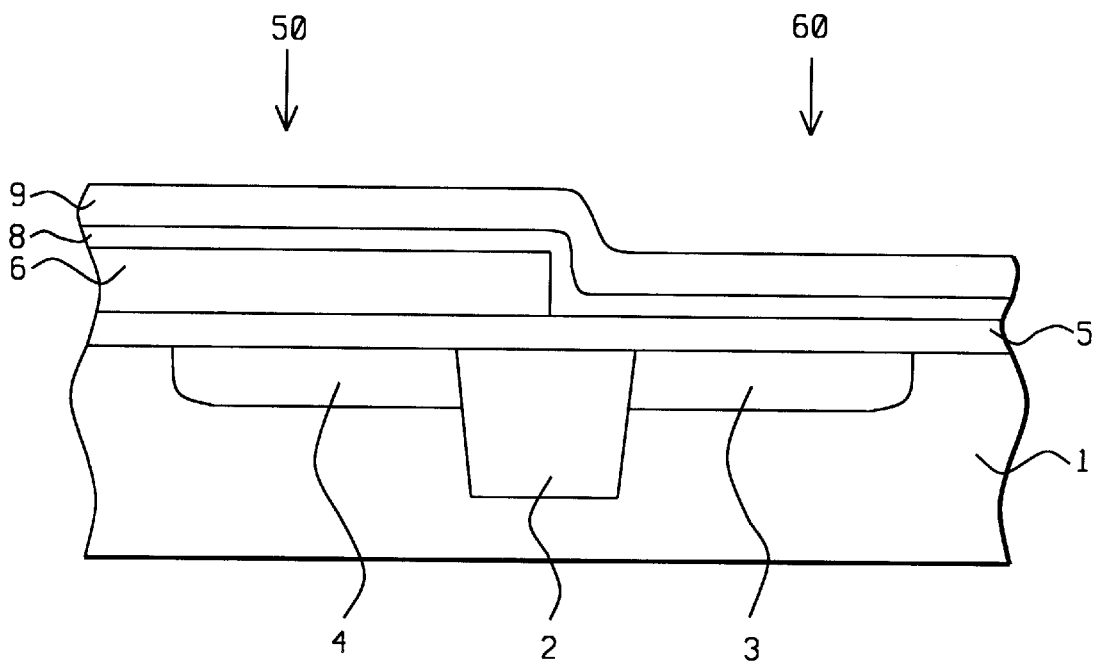

Photoresist shape 7, is next defined and used as an mask to protect NMOS region 50, from a RIE procedure used to selective remove silicon nitride layer 6, from the top surface of silicon oxide layer 5, in PMOS region 60. The RIE procedure is performed using Cl$_2$ as an etchant for silicon nitride, with a high etch rate ratio of silicon nitride to silicon oxide in a Cl$_2$ ambient, allowing the RIE procedure to selectively terminate at the appearance of silicon oxide layer 5. The result of this procedure is schematically shown in FIG. 2. After removal of photoresist shape 7, via plasma oxygen ashing procedures, silicon nitride layer 8, is conformally deposited at a thickness between about 50 to 500 Angstroms, via LPCVD or PECVD procedures, followed by a conformal deposition of silicon oxide layer 9, at a thickness between about 50 to 200 Angstroms, again via LPCVD or PECVD procedures. The result of these depositions are schematically illustrated in FIG. 3. The difference in thickness of the insulator stacks in NMOS. region 50, and in PMOS region 60, resulting from the presence of silicon nitride layer 6, in only NMOS region 50, will subsequently determine the difference in channel lengths for both device types.

Figure 4:
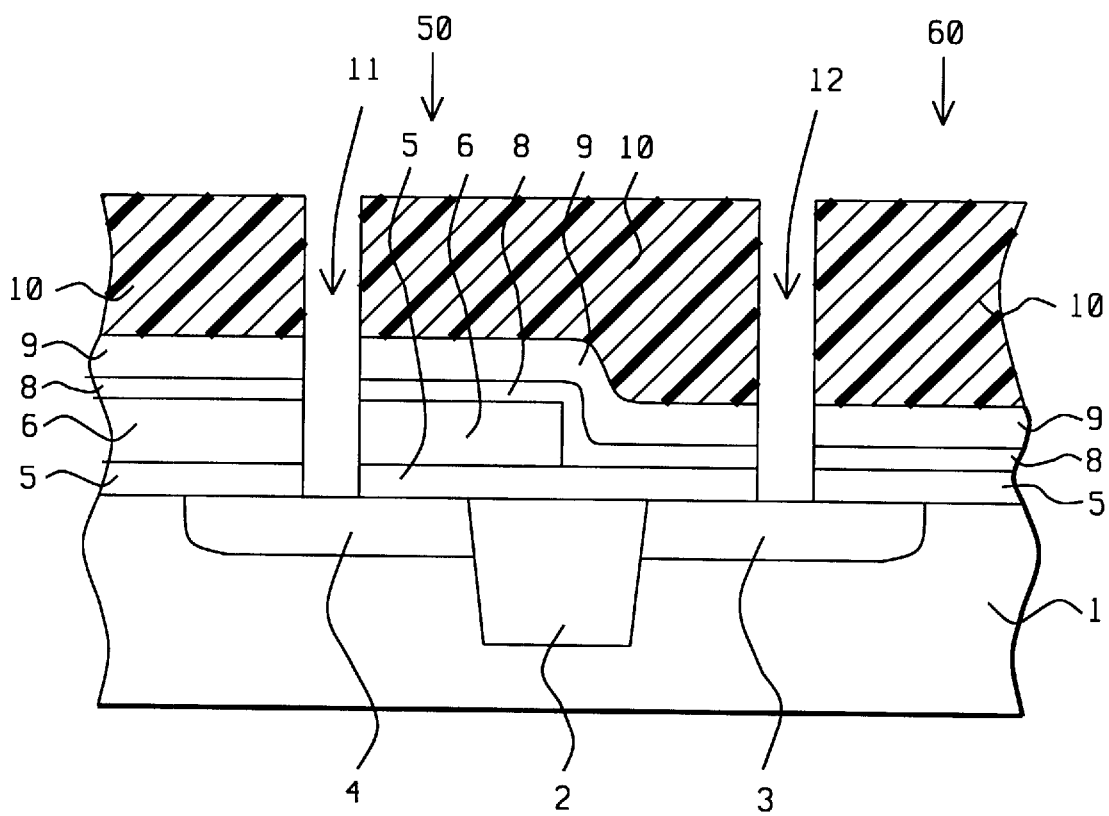

Photoresist shape 10, is now used as a mask to allow channel opening 11, in NMOS region 50, and channel opening 12, located in PMOS region 60, to be defined. An anisotropic RIE procedure is employed, first using CHF$_3$ as an etchant for silicon oxide layer 9, terminating at the appearance of silicon nitride layer 8. At this stage of the anisotropic RIE procedure Cl$_2$ is used to selectively remove silicon nitride layer 8, and silicon nitride layer 6, for channel opening 11, and to remove only silicon nitride layer 8, for channel opening 12. This selective dry etch procedure using Cl$_2$ as the etchant terminates at the top surface of silicon oxide layer 5, therefore the additional time needed to remove both silicon nitride layers in channel opening 11, did not result in additional etching in channel opening 12. The anisotropic RIE procedure is then continued using CHF$_3$ as an etchant for silicon oxide layer 5, resulting in NMOS channel opening 11, exposing a portion of the top surface of heavily doped N type drain region 4, and resulting in PMOS channel opening 12, exposing a portion of the top surface of heavily doped P type source region 3. The diameter of channel opening 11, and of channel opening 12, is between about 0.5 to 2 um. This is schematically shown in FIG. 4. Photoresist shape 10, is then removed via plasma oxygen ashing procedures.

Figure 5:
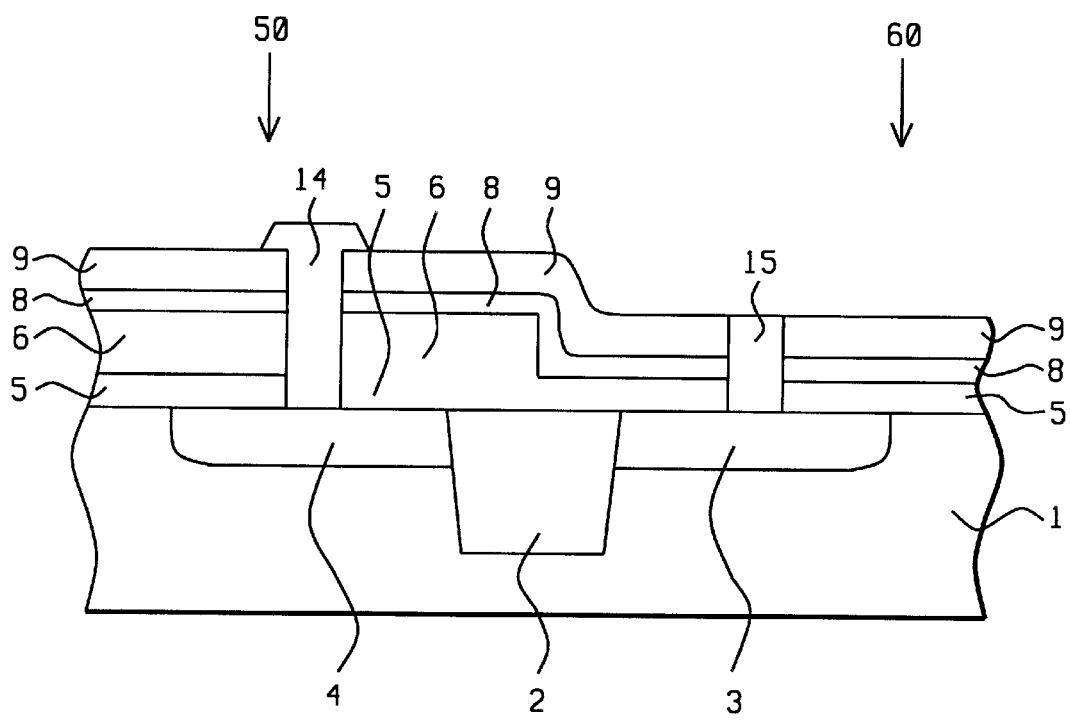

A buffered hydrofluoric (BHF), or dilute hydrofluoric (DHF), pre-clean procedure is next performed prior to selective growth of intrinsic silicon, in NMOS channel opening 11, and in PMOS channel opening 12. Single crystalline silicon is epitaxially grown on the underlying drain regions, at a temperature between about 800 to 1200° C., at a pressure between about 10 to 50 torr, using silane or dichlorosilane as a source. The silicon epitaxial growth, selectively grown only on exposed silicon regions, specifically the drain regions, completely fills the channel openings without forming on the top surface of silicon nitride layer 8, resulting in silicon cylindrical shape 14, in NMOS opening 11, and silicon cylindrical shape 15, in PMOS channel opening 12. This is schematically shown in FIG. 5. The variable length channel regions will be obtained as a result of the difference in depth of the channel openings. The epitaxially grown, undoped cylindrical shapes grow laterally after filling openings 11 and 12, resulting in a portion of cylindrical shapes 14 and 15, overlying portions of the top surface of silicon oxide layer 9. The lateral over growth portion of the cylindrical shapes, initiating after complete filling of openings 11 and 12, allow the heights of cylindrical shapes 14 and 15, be determined by the depth of openings 11 and 12, respectfully. This is schematically shown in FIG. 5.

Figure 6:
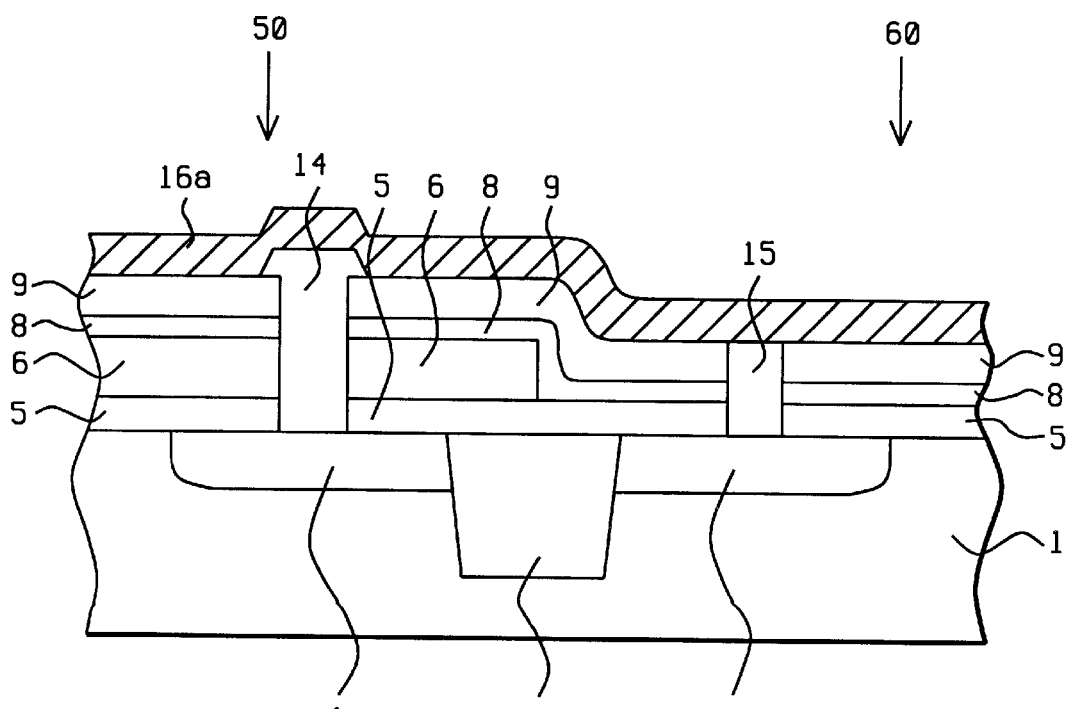
Figure 7:
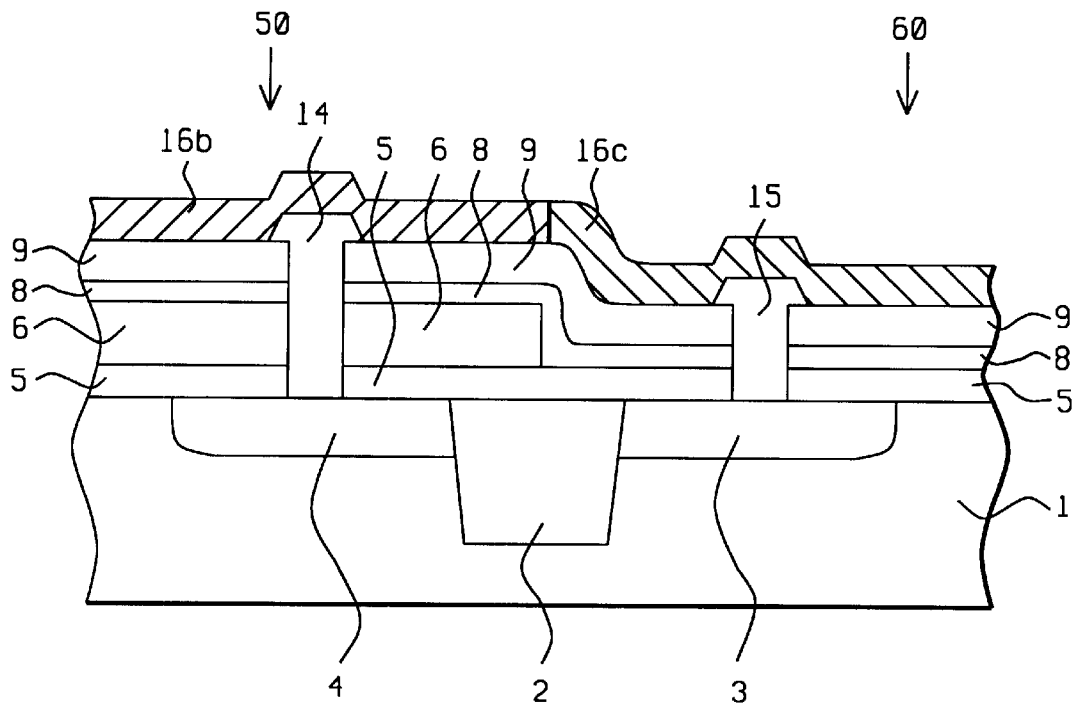

Intrinsic polysilicon layer 16a, shown schematically in FIG. 6, is next deposited via LPCVD procedures to a thickness between about 400 to 1000 Angstroms. A photoresist shape, not shown in the drawings, is next used to block NMOS region 50, from implantation of boron ions at an energy between about 2 to 10 KeV, and at a dose between about 1E15 to 5E15 atoms/cm$^2$, converting exposed portions of intrinsic polysilicon layer 16a, to P type polysilicon layer 16c. After removal of the NMOS photoresist block out shape another photoresist shape is used to protect PMOS region 60, from implantation of arsenic or phosphorous ions, at an energy between about 40 to 70 KeV, and at a dose between about 1E15 to 6E15 atoms/cm$^2$, resulting in N type polysilicon layer 16b, in unprotected portions of intrinsic polysilicon layer 16a. The result of the procedures used to dope intrinsic polysilicon layer 16a, is schematically shown in FIG. 7. Removal of the PMOS photoresist block out shape is again accomplished via plasma oxygen ashing procedures.

Figure 8:
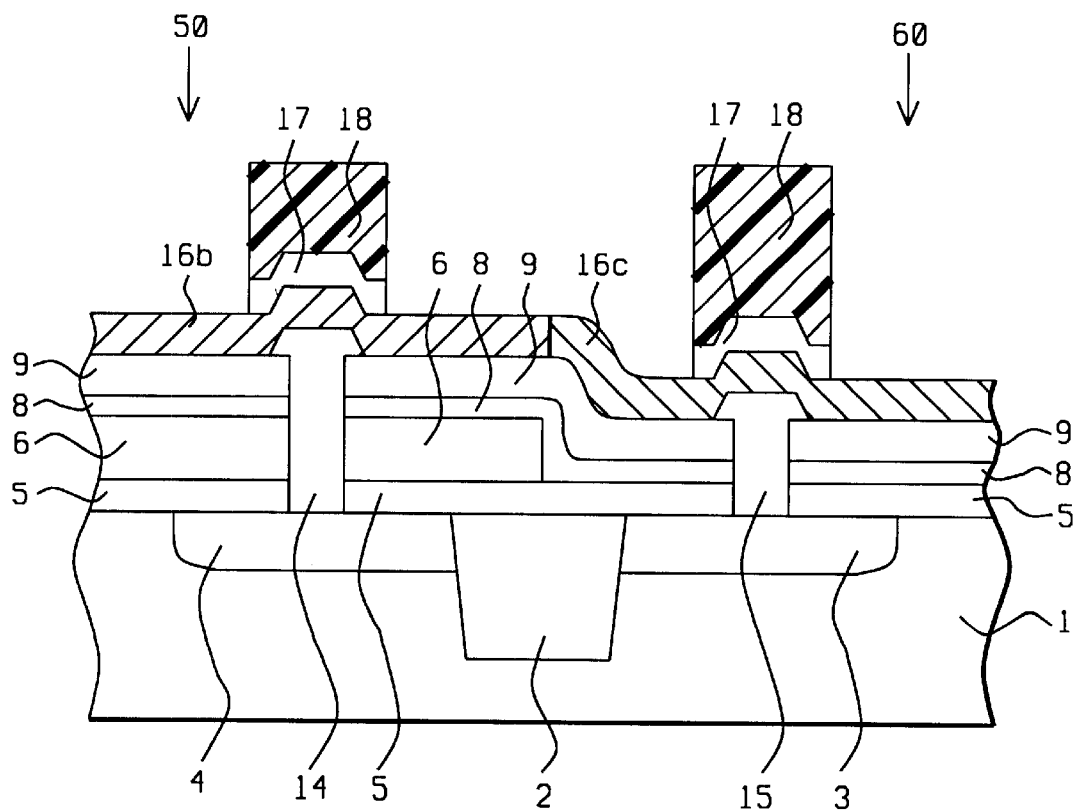
Figure 9:
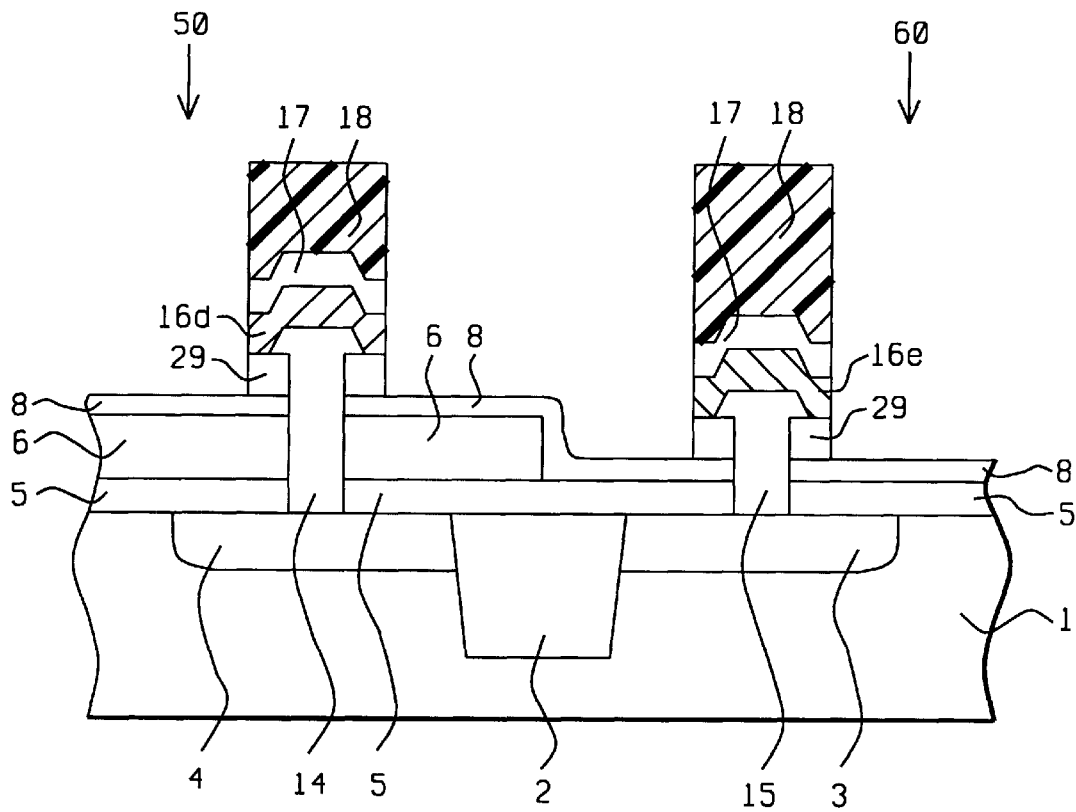

Silicon oxide layer 17, to be used as a hard mask for subsequent patterning procedures, is next deposited via LPCVD or PECVD procedures at a thickness between about 200 to 500 Angstroms. Photoresist shapes 18, are then formed and used as a mask to allow an anisotropic RIE procedure, using CHF$_3$ as an etchant, to define the desired source shape in silicon oxide layer 17. This is schematically shown in FIG. 8. The anisotropic RIE procedure is then continued using Cl$_2$ as an etchant to define the N type polysilicon source shape 16d, and to define P type polysilicon source shape 16e. The final stage of the anisotropic RIE procedure features definition of silicon oxide spacers 29, via removal of exposed regions of silicon oxide layer 9, using CHF$_3$ as an etchant. This is schematically shown in FIG. 9.

Figure 10:
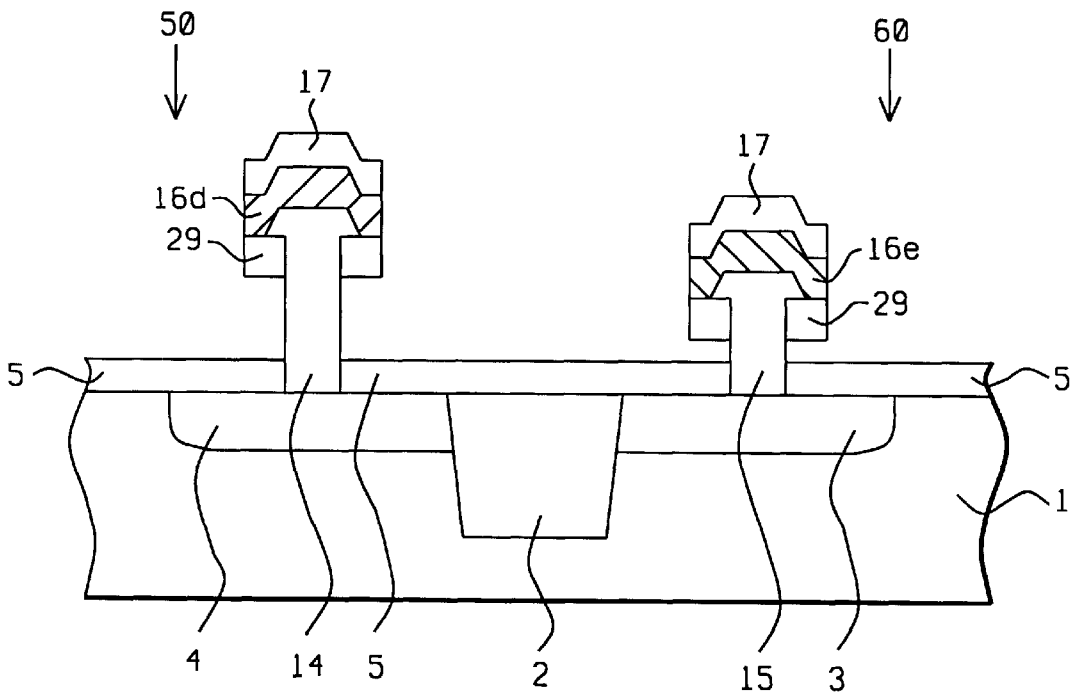
Figure 11:
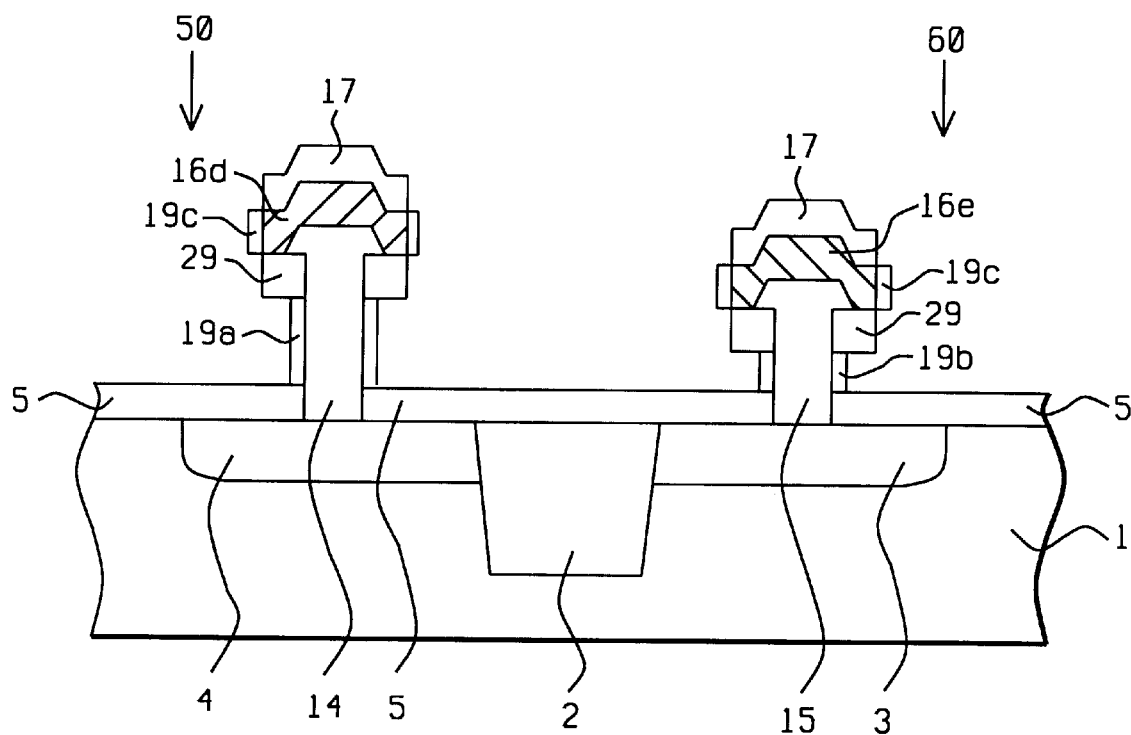

After removal of photoresist shapes 18, via plasma oxygen ashing procedures, a hot phosphoric acid solution is used to selectively remove silicon nitride layer 8, and silicon nitride layer 6, resulting in exposure of a portion silicon cylindrical shape region 14, regarded as the NMOS channel region, and of a portion of silicon cylindrical shape 15, to be used as the PMOS channel region. This is schematically shown in FIG. 10. A thermal oxidation procedure, performed at a temperature between about 800 to 1200° C., in an oxygen—steam ambient, is next used to form silicon dioxide gate insulator layer 19a, on the NMOS channel region, and to form silicon dioxide gate insulator layer 19b, on the shorter, or narrower PMOS channel region, both at a thickness between about 10 to 100 Angstroms. The thermal oxidation procedure also results in the growth of silicon oxide layers 19c, on the exposed sides of N type polysilicon source shape 16d, and on the exposed sides of P type polysilicon source shape 16e. This is schematically illustrated in FIG. 11. If desired a high k dielectric layer such as hafnium oxide (HfO$_2$), or zirconium oxide (ZrO$_2$) at a thickness between about 10 to 100 Angstroms, can be formed via atomic layer deposition (ALD), and used as a gate insulator layer.

Figure 12:
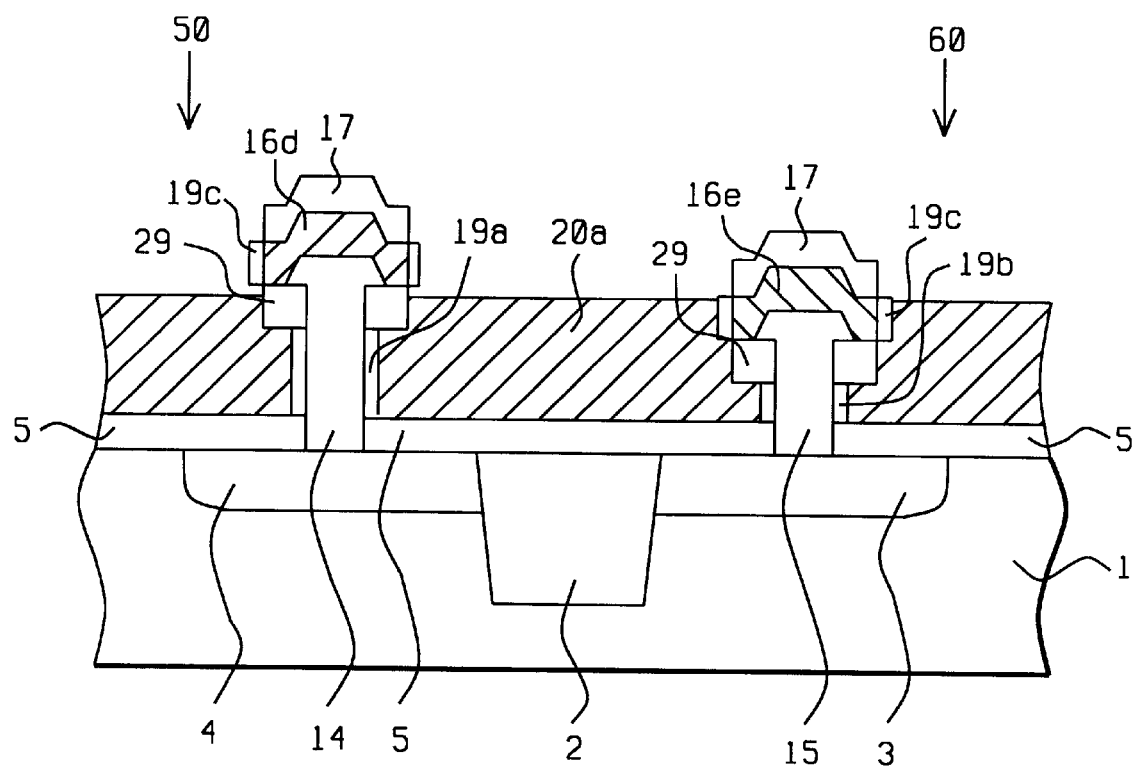
Figure 13:
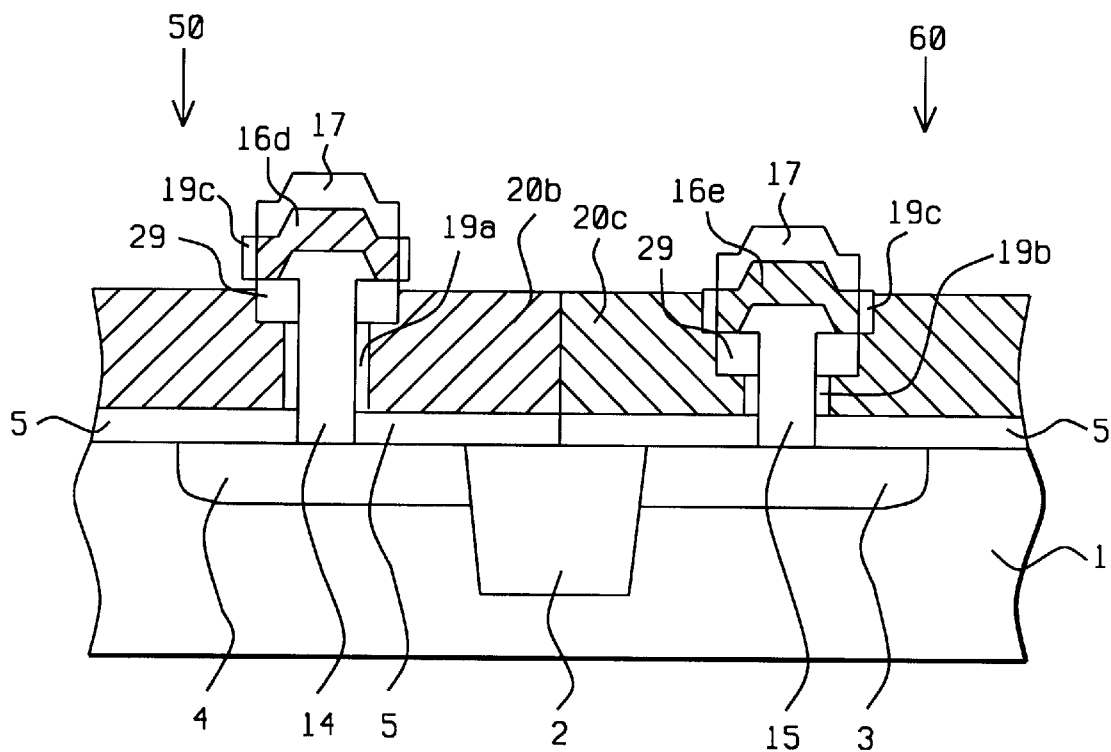

Intrinsic polysilicon layer 20a, is next deposited via LPCVD procedures to a thickness between about 1000 to 2000 Angstroms. A selective RIE procedure, using Cl$_2$ or SF$_6$ as an etchant for polysilicon, is used to remove the top portion of intrinsic polysilicon layer 20a, to a point at which the top surface of silicon oxide shape 17, located in PMOS region 60, is exposed, while the top surface o the remaining portion of intrinsic polysilicon layer 20a, in NMOS region 50, is at a level adjacent to silicon oxide spacers 29. This is schematically shown in FIG. 12. A photoresist shape, not shown in the drawings, is next used to block NMOS region 50, from implantation of boron ions performed at an energy between about 20 to 50 KeV, and at a dose between about 1E15 to 5E15 atoms/cm$^2$, converting exposed portions of intrinsic polysilicon layer 20a, to P type polysilicon layer 20c. After removal of the NMOS photoresist block out shape another photoresist shape is used to protect PMOS region 60, from implantation of arsenic or phosphorous ions, performed at an energy between about 50 to 100 KeV, and at a dose between about 1E15 to 6E15 atoms/cm$^2$, resulting in N type polysilicon layer 20b, in unprotected portions of intrinsic polysilicon layer 20a. The result of the procedures used to dope intrinsic polysilicon layer 20a, is schematically shown in FIG. 13. The photoresist shape, used to block out PMOS region during the N type doping of intrinsic polysilicon layer 20a, is then removed via plasma oxygen ashing procedures.

Figure 14:
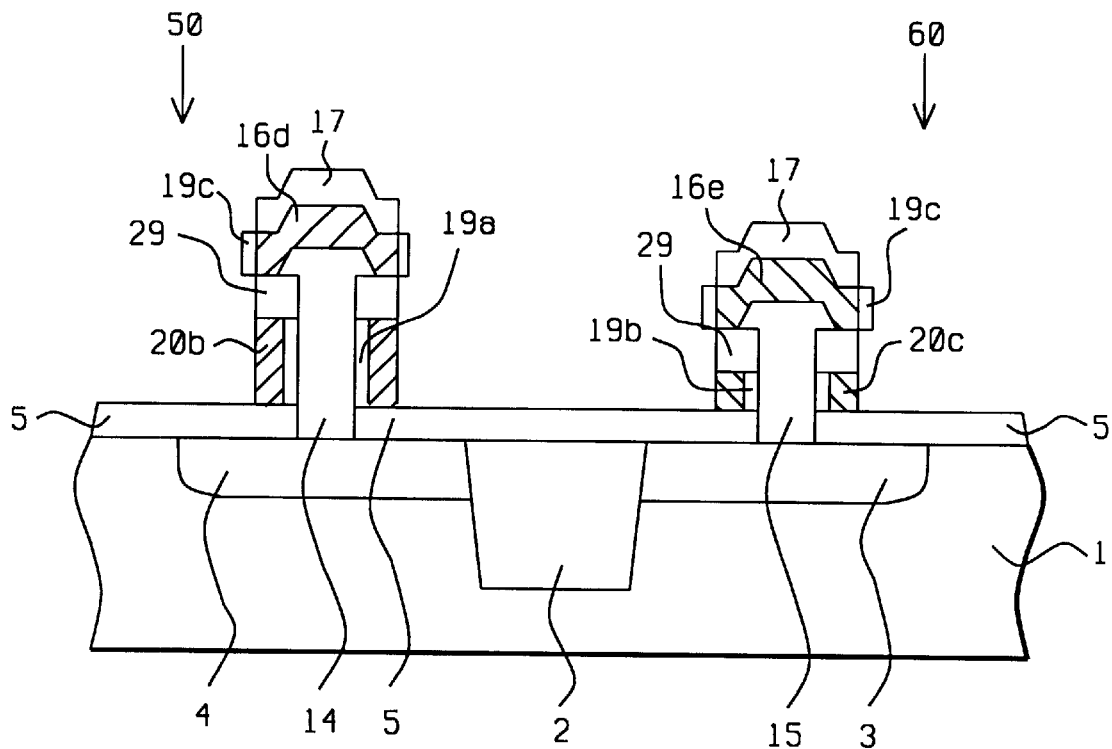

A self-aligned dry etch procedure, performed without photoresist masking, is next employed to remove portions of doped polysilicon, using silicon oxide shapes 17, as a hard mask. The dry etch procedure is an anisotropic RIE procedure, using Cl$_2$ or SF$_6$ as an etchant for polysilicon. A high etch rate ratio of polysilicon to silicon oxide, between about 10 to 100, to 1, allows this selective dry etch procedure to terminate at the top surface of silicon oxide layer 5. The result of this procedure, schematically shown in FIG. 14, is the formation of N type polysilicon gate structure 20b, in NMOS region 50, and the formation of P type polysilicon gate structure 20c, in PMOS region 60. The vertical CMOS devices are now comprised of channel regions 14 and 15; silicon dioxide gate insulator layers 19a and 19b; doped polysilicon gate structures 20b and 20c; heavily doped drain regions 3 and 4, doped polysilicon source shapes 16d and 16e; and silicon oxide spacers 29. The channel length for a specific CMOS device was determined by the thickness of the composite insulator layer in which the channel opening was defined in. Therefore to obtain devices with variable channel lengths various procedures, such as deposition and selective patterning, can be employed to obtain the desired menu of channel lengths. Although this invention was described with for a PMOS device comprised with a shorter channel length than the channel length of the NMOS device, it should be understood that any combination of variable channel lengths are obtainable via use of this invention.

While this invention has been particularly shown and described with reference to the preferred embodiments thereof, it will be understood by those skilled in the art that various changes in form and details may be made without departing from the spirit or scope of the invention.

What is claimed is:

1. A method of forming vertical, complimentary metal oxide semiconductor (CMOS), devices on a semiconductor substrate, comprising the steps of:

providing a first region of said semiconductor substrate to accommodate first type CMOS devices, and providing a second region of said semiconductor substrate to accommodate second type CMOS devices;

forming a first heavily doped drain region, of a first conductivity type, in a top portion of said first region of said semiconductor substrate, and forming a second heavily doped drain region, of a second conductivity type, in a top portion of said second region of said semiconductor substrate;

depositing a first silicon oxide layer on said semiconductor substrate;

forming a silicon nitride shape on said first silicon oxide layer, in said first region of said semiconductor substrate;

depositing a thin silicon nitride layer and an overlying second silicon oxide layer over said semiconductor substrate;

forming a first channel opening in said second silicon oxide layer, in said thin silicon nitride layer, in said silicon nitride shape, and in said first silicon oxide layer, exposing a portion of a top surface of said first heavily doped drain region, and forming a second channel opening in said second silicon oxide layer, in said thin silicon nitride layer, and in said first silicon oxide layer, exposing a portion of a top surface of said second heavily doped drain region;

forming a first silicon shape in said first channel opening, and forming a second silicon shape in second channel opening;

depositing a first intrinsic polysilicon layer over said first and second silicon shapes;

performing ion implantation procedures to convert a first portion of said first intrinsic polysilicon layer to a first doped polysilicon region of a first conductivity type, and to convert a second portion of said first intrinsic polysilicon layer to a second doped polysilicon region of a second conductivity type;

depositing a third silicon oxide layer on said first and second doped polysilicon regions;

forming photoresist shapes on said third silicon oxide layer, and on said first and second silicon shapes; performing an anisotropic dry etching procedure by using photoresist shapes as masks to remove portions of said third silicon oxide layer to form overlying silicon oxide shapes, removing portions of said first and second doped polysilicon regions to form a first polysilicon source shape of a first conductivity type in said first region and a second polysilicon source shape of a second conductivity type in said second region of said semiconductor substrate; removing portions of said second silicon oxide layer to form underlying silicon oxide spacers; removing said photoresist shapes;

performing a wet etch procedure to remove said thin silicon nitride layer and said silicon nitride shape, to expose a portion of said first silicon shape, to be used as a first channel region in said first region of semiconductor substrate, and to remove said thin silicon nitride layer to expose a portion of said second silicon shape, to be used as a second channel region in said second region of said semiconductor substrate, wherein said first channel region having a larger channel length than said second channel region;

growing a silicon dioxide gate insulator layer on said first channel region and on said second channel region, while forming a fourth silicon oxide layer on exposed sides of said first and second polysilicon source shapes;

depositing a thick, second intrinsic polysilicon layer on said first silicon oxide layer;

performing ion implantation procedures to convert a first portion of said thick, second intrinsic polysilicon layer to a first doped thick polysilicon region of a first conductivity type, and to convert a second portion of said thick, second intrinsic polysilicon layer to a second doped thick polysilicon region of a second conductivity type; and performing an anisotropic dry etch procedure by using said silicon oxide shapes as a hard mask to remove portions of said first and second doped thick polysilicon regions, thereby forming a first self-aligned polysilicon gate structure in said first region of said semiconductor substrate, and forming a second self-aligned polysilicon gate structure in said second region of said semiconductor substrate.

2. The method of claim 1, wherein said first type CMOS devices are N channel or NMOS devices, while said second type CMOS devices are P channel or PMOS devices.

3. The method of claim 1, wherein said first heavily doped drain region is a heavily doped N type drain region, obtained via implantation of arsenic or phosphorous ions, at an energy between about 40 to 90 KeV, and at a dose between about 1E15 to 8E15 atoms/cm$^2$.

4. The method of claim 1, wherein said second heavily doped drain region is a heavily doped P type drain region, obtained via implantation of boron ions, at an energy between about 2 to 10 KeV, and at a dose between about 1E15 to 6E15 atoms/cm$^2$.

5. The method of claim 1, wherein said first silicon oxide layer is obtained via LPCVD or PECVD procedures, at a thickness between about 50 to 200 Angstroms.

6. The method of claim 1, wherein said silicon nitride shape is defined via anisotropic RIE procedures, using Cl$_2$ as an etchant, performed to a silicon nitride layer which in turn is obtained via LPCVD or PECVD procedures at a thickness between about 300 to 5000 Angstroms.

7. The method of claim 1, wherein said thin silicon nitride layer is obtained via LPCVD or PECVD procedures, at a thickness between about 50 to 500 Angstroms.

8. The method of claim 1, wherein said first channel opening, and said second channel opening, are formed via an anisotropic RIE procedure using CHF$_3$ as an etchant for said first and second silicon oxide, oxide and using Cl$_2$ as an etchant for said thin silicon nitride layer and said silicon nitride shape.

9. The method of claim 1, wherein the diameter of said first channel opening, and of said second channel opening, is between about 0.5 to 2.0 um.

10. The method of claim 1, wherein said first silicon shape, and said second silicon shape, are comprised of intrinsic silicon, obtained via selective epitaxial growth of silicon, with the epitaxial silicon growth procedure performed at a temperature between about 800 to 1200° C., and at a pressure between about 10 to 50 torr.

11. The method of claim 1, wherein said first intrinsic polysilicon layer is obtained via LPCVD procedures, at a thickness between about 400 to 1000 Angstroms.

12. The method of claim 1, wherein said first doped polysilicon region is formed via implantation of arsenic or phosphorous ions into said first portion of said first intrinsic polysilicon layer, at an energy between about 40 to 70 KeV, and at a dose between about 1E15 to 6E15 atoms/cm$^2$.

13. The method of claim 1, wherein said second doped polysilicon region is formed via implantation of boron into said second portion of said first intrinsic polysilicon layer, at an energy between about 2 to 10 KeV, and at a dose between about 1E15 to 5E15 atoms/cm$^2$.

14. The method of claim 1, wherein said third silicon oxide layer is obtained via LPCVD or PECVD procedures, at a thickness between about 200 to 500 Angstroms.

15. The method of claim 1, wherein said silicon dioxide gate insulator layer is obtained at a thickness between about 10 to 100 Angstroms, via thermal oxidation procedures performed at a temperature between about 800 to 1200° C., in an oxygen—steam ambient.

16. The method of claim 1, wherein said thick, second intrinsic polysilicon layer is obtained via LPCVD procedures, at a thickness between about 1000 to 2000 Angstroms.

17. The method of claim 1, wherein said first doped thick polysilicon region is formed via implantation of arsenic or phosphorous ions into said first portion of said thick, second intrinsic polysilicon layer, performed at an energy between about 50 to 100 KeV, and at a dose between about 1E15 to 6E15 atoms/cm$^2$.

18. The method of claim 1, wherein said second doped thick polysilicon region is formed via implantation of boron into said second portion of said thick, second intrinsic, polysilicon layer, performed at an energy between about 20 to 50 KeV, and at a dose between about 1E15 to 5E15 atoms/cm$^2$.

19. The method of claim 1, wherein said first and second self-aligned polysilicon gate structures are defined via a selective, anisotropic RIE procedure, using $Cl_2$ or $SF_6$ as an etchant.

20. A method of forming vertical CMOS devices, with variable channel lengths, on a semiconductor substrate, comprising the steps of:

providing a first region of said semiconductor substrate to accommodate an N channel (NMOS) device, and providing a second region of said semiconductor substrate to accommodate a P channel (PMOS) device;

forming an N type drain region for said NMOS device, in a top portion of said first region of said semiconductor substrate, and forming a P type drain region for said PMOS device, in a top portion of said second region of said semiconductor substrate;

depositing a first silicon oxide layer on said semiconductor substrate;

depositing a first silicon nitride layer on said first silicon oxide layer;

performing a patterning procedure to remove a portion of said first silicon nitride layer from said first silicon oxide layer in said second region of said semiconductor substrate;

depositing a second silicon nitride layer on said first silicon nitride layer in said first region of said semiconductor substrate, and on said first silicon oxide layer in said second region of said semiconductor substrate;

depositing a second silicon oxide layer on said second silicon nitride layer;

forming an NMOS channel opening in said second silicon oxide layer, in said second silicon nitride layer, in said first silicon nitride layer, and in said first silicon oxide layer, exposing a portion of a top surface of said N type drain region, and forming a PMOS channel opening in said second silicon oxide layer, in said second silicon nitride layer, and in said first silicon oxide layer, exposing a portion of a top surface of said P type drain region;

performing a selective epitaxial deposition of silicon to form a first silicon shape in said NMOS channel opening, and to form a second silicon shape in said PMOS channel opening;

depositing a first intrinsic polysilicon layer on said first and second silicon shapes;

performing ion implantation procedures to convert a first portion of said first intrinsic polysilicon layer, located overlying said first silicon shape, to a first N type polysilicon region, and to convert a second portion of said first intrinsic polysilicon layer, located overlying said second silicon shape, to a first P type polysilicon region;

depositing a third silicon oxide layer on said first N type polysilicon region and said first P type polysilicon region;

forming photoresist shapes on said third silicon oxide layer, and on said first and second silicon shapes performing an anisotropic reactive ion etch (RIE), by using photoresist shapes as masks; to remove portions of said third silicon oxide layer to form silicon oxide hard mask shapes; to remove portions of said first N type and first P type polysilicon regions to define an N type polysilicon source shape in said first region of said semiconductor substrate, and to define a P type polysilicon source shape in said second region of said semiconductor substrate; and to remove portions of said second silicon oxide layer to define silicon oxide spacers removing said photoresist shapes;

performing a wet etch procedure to remove said second silicon nitride layer and said first silicon nitride layer to expose a portion of said first silicon shape to be used as an NMOS channel region in said first region of semiconductor substrate, and exposing a portion of said second silicon shape to be used as a PMOS channel region in said second region of said semiconductor substrate, wherein said NMOS channel region having a larger channel length than said PMOS channel region;

performing a thermal oxidation procedure to grow a silicon dioxide gate insulator layer on said NMOS channel region and on said PMOS channel region, and to grow a silicon oxide layer on exposed sides of said N type polysilicon source shape, and on exposed sides of said P type polysilicon source shape;

depositing a thick, second intrinsic polysilicon layer on said first silicon oxide layer;

performing ion implantation procedures to convert a first portion of said thick, second intrinsic polysilicon layer to a thick N type polysilicon region, and to convert a second portion of said thick, second intrinsic polysilicon layer to a thick P type polysilicon region; and performing an anisotropic dry etch procedure by using said silicon oxide hard mask shapes as an etch mask to remove portions of said thick N type polysilicon region and to remove portions of said thick P type polysilicon region, thereby forming an N type self-aligned polysilicon gate structure in said first region of said semiconductor substrate, and forming a P type self-aligned polysilicon gate structure in said second region of said semiconductor substrate.

21. The method of claim 20, wherein said first silicon oxide layer is obtained via LPCVD or PECVD procedures, at a thickness between about 50 to 200 Angstroms.

22. The method of claim 20, wherein said first silicon nitride layer is obtained via LPCVD or PECVD procedures at a thickness between about 300 to 5000 Angstroms.

23. The method of claim 20, wherein said second silicon nitride layer is obtained via LPCVD or PECVD procedures, at a thickness between about 50 to 500 Angstroms.

24. The method of claim 20, wherein said NMOS channel opening, and said PMOS channel opening, are formed via an anisotropic RIE procedure, using $CHF_3$, as an etchant for said first and second silicon oxide layers, and using $Cl_2$ as an etchant for said first and second silicon nitride layers.

25. The method of claim 20, wherein the diameter of said NMOS channel opening, and the diameter of said PMOS channel opening, is between about 0.5 to 2.0 um.

26. The method of claim 20, wherein said selective epitaxial deposition of silicon is performed at a temperature between about 800 to 1200° C., and at a pressure between about 10 to 50 torr, using silane or dichlorosilane as a source.

27. The method of claim 20, wherein said first intrinsic polysilicon layer is obtained via LPCVD procedures, at a thickness between about 400 to 1000 Angstroms.

28. The method of claim 20, wherein said third silicon oxide layer is obtained via LPCVD or PECVD procedures, at a thickness between about 200 to 500 Angstroms.

29. The method of claim 20, wherein said silicon dioxide gate insulator layer is obtained at a thickness between about 10 to 100 Angstroms, via thermal oxidation procedures performed at a temperature between about 800 to 1200° C., in an oxygen—steam ambient.

30. The method of claim 20, wherein said thick, second intrinsic polysilicon layer is obtained via LPCVD procedures, at a thickness between about 1000 to 2000 Angstroms.

31. The method of claim 20, wherein said N type self-aligned polysilicon gate structure and said P type self-aligned polysilicon gate structure, are defined via a selective, anisotropic RIE procedure, using $Cl_2$ or $SF_6$ as an etchant.

* * * * *